United States Patent
Tone et al.

(10) Patent No.: US 6,686,536 B2
(45) Date of Patent: Feb. 3, 2004

(54) METHOD OF FORMING ELECTRODE SECTION ON INNER SURFACE OF TRANSPARENT ELECTROMAGNETIC WAVE SHIELDING PLATE, AND TRANSPARENT ELECTROMAGNETIC WAVE SHIELDING PLATE FORMED THEREBY

(75) Inventors: Masashi Tone, Tokyo (JP); Shun Hasegawa, Chiba (JP); Gen Masuda, Chiba (JP); Yasushi Hasegawa, Tokyo (JP); Yatsuhiro Hasegawa, Chiba (JP); Shigekazu Hasegawa, Chiba (JP)

(73) Assignees: Nisshinbo Industries, Inc., Tokyo (JP); Hasegawa Chemical Industry Co., Ltd., Yachiyo (JP)

( * ) Notice: Subject to any disclaimer, the term of this patent is extended or adjusted under 35 U.S.C. 154(b) by 106 days.

(21) Appl. No.: 09/971,123

(22) Filed: Oct. 5, 2001

(65) Prior Publication Data

US 2002/0042162 A1 Apr. 11, 2002

(51) Int. Cl.⁷ ................................................. H05K 9/00
(52) U.S. Cl. .................................. 174/35 MS; 313/479; 348/819
(58) Field of Search .......................... 174/35 MS, 35 R; 313/479; 361/800, 816, 818; 348/819

(56) References Cited

U.S. PATENT DOCUMENTS 4,900,877 A   2/1990   Dubrow et al.
5,250,342 A   10/1993  Lang et al.
6,417,619 B1 * 7/2002  Yasunori et al. ............ 313/582

FOREIGN PATENT DOCUMENTS

| EP | 0 910 107 | 4/1999 |
| EP | 0 944 299 | 9/1999 |
| EP | 0 977 167 | 2/2000 |

* cited by examiner

Primary Examiner—Hung V. Ngo
(74) Attorney, Agent, or Firm—Westerman, Hattori, Daniels & Adrian, LLP

(57) ABSTRACT

This invention provides a method of forming an electrode section on the inner surface of the transparent, electromagnetic wave shielding plate, composed of a transparent substrate coated with an electroconductive member and transparent film in this order. These are laminated into a monolithic structure via a heat-bond film. (a) The components of the transparent, electromagnetic wave shielding plate are laminated by hot pressing into the monolithic structure, after replacing the perimeter or part of the heat-bond film corresponding to the electrode section by a frame member almost as thick as the heat-bond film. (b) The frame member and part of the outer transparent film are removed. Both of these correspond to the electrode section, or only the outer transparent film for the part corresponds to the electrode section. (c) The electroconductive section of the electroconductive member is exposed to the surface layer section by the above steps (a) and (b). This invention also provides the transparent, electromagnetic wave shielding plate and electromagnetic wave shielding front plate for PDP's produced by the same method.

5 Claims, 6 Drawing Sheets

METHOD OF FORMING ELECTRODE SECTION ON INNER SURFACE OF TRANSPARENT ELECTROMAGNETIC WAVE SHIELDING PLATE, AND TRANSPARENT ELECTROMAGNETIC WAVE SHIELDING PLATE FORMED THEREBY

TECHNICAL FIELD

This invention relates to a method of producing a transparent electromagnetic wave shielding plate for shielding electromagnetic waves and the transparent electromagnetic wave shielding plate produced thereby, more particularly a method of forming an electrode section which can be easily grounded to exhibit the electromagnetic wave shielding effect for a transparent electromagnetic wave shielding plate used as the front plate to be disposed on the front face of a display panel for plasma display (hereinafter sometimes referred to as plasma display panel (PDP)) and medical equipment, and a transparent electromagnetic wave shielding plate having the electrode section and electromagnetic wave shielding front plate for a PDP.

BACKGROUND OF THE INVENTION

Recently, a number of electronic devices utilizing, e.g., electrical, electronic and wave devices, have spread as a result of progress of electronic technologies. Some of these devices radiate electromagnetic waves harmful to human and other devices, which has been increasingly causing problems. Therefore, the countermeasures against these problems are becoming very important.

It is reported that large quantities of harmful electromagnetic waves of non-ionized ray, e.g., microwaves and radio waves, are emitted from surfaces of displays, e.g., those for a variety of computers (e.g., office and factory automation devices), game machines and TV sets. Recently, adverse effects of these electromagnetic waves on human health have been pointed out, and their interference with other devices gives rise to social problems.

More recently, a plasma display panel (PDP) as light-emitting, planar display panel has been attracting attention as a large-size display excellent in visibility. However, the PDP emits more intense electromagnetic waves leaking out of the front face than the conventional display panel, e.g., cold-cathode ray tube (CRT) or liquid crystal display panel (LCD), and hence is strongly required to have a better electromagnetic wave shielding function.

The troubles caused by electromagnetic waves are generally controlled by electromagnetic wave shielding materials. An electromagnetic wave shielding material covers an electronic device, building or the like to prevent penetration of the waves from the outside, or to contain the waves inside. Some of the applicable areas for electromagnetic wave shielding materials are front plates for PDPs, and transparent plates disposed on, e.g., front faces of a variety of electronic and medical devices, to shield electromagnetic waves for these devices.

The transparent electromagnetic wave shielding plate, which can find various applicable areas, must be grounded to exhibit its inherent electromagnetic wave shielding effects. In other words, it can fully exhibit its electromagnetic wave shielding effects, when it is ground from its outer surface, preferably from its entire outer surfaces.

It is very advantageous for the transparent electromagnetic wave shielding plate, which is in the form of plate, to have the electrode section exposed to the inner surface inside of the assembly, because it can be mounted on a variety of devices and connected to the outside terminals for grounding from its outer surface by simply pressing the plate to the outer frame of the device.

A transparent electromagnetic wave shielding plate formed using a hot-bonding film is disclosed by, e.g., Japanese Patent Laid-Open No. 292575/1999 as an electromagnetic wave shielding type light-permeating window panel material The publication proposes a method of forming an electrode section comprising electroconductive members extended to the outside of the outer surface of a formed article on which it is to be mounted, in such a way that it is rolled into the inside of the inner surface and fixed by means of an electroconductive adhesive tape to finally form the electrode section on the inner surface of the formed article's front face. This method, however, is disadvantageous in that it requires much labor and skillfulness for forming the electrode section.

It involves another disadvantage that the electroconductive member is limited to a form of flexible fibrous meshes, because the electrode is rolled into the inside of the inner surface, and a film-shaped electroconductive member, e.g., metallic mesh film, cannot be used for its rigidity.

Techniques for heat-bonding a variety of members to each other into a monolithic laminate by hot pressing using a heat-bond film are disclosed by Japanese Patent Laid-Open Nos. 352318/1999 and 28813/2000, where the hot-bonding film used for these inventions can simultaneously bond a number of members into a monolithic laminate, fast under heating to be molten or under pressure.

These known or traditional methods can propose production of a monolithic laminate of heat-bond film, transparent optical film and electroconductive member which is wider than these films and positioned inside of them, to have the electrode section on the inner surface of the formed article. These methods, however, have a disadvantage that the electroconductive member may not be securely exposed to the inner surfaces, when the heat-bond film is molten and oozes out during the hot-bonding step to cover the electroconductive member surfaces.

Reducing size of the heat-bond film further to avoid oozing-out of the film may form defects in the space between the film and outer transparent optical film. Therefore, it is practically impossible to control melting and oozing-out of the heat-bond film.

It is an object of the present invention to provide a method of forming an electrode section on the inner surface of a transparent, electromagnetic wave shielding plate, which can solve the problems involved in the conventional transparent, electromagnetic wave shielding plate, allow its transparent substrate, electroconductive member and transparent film to be fast adhered to each other, and also allow the plate to be easily grounded. It is another object of the present invention to provide the transparent, electromagnetic wave shielding plate and electromagnetic wave shielding front plate for PDP's produced by the same method.

DISCLOSURE OF THE INVENTION

The inventors of the present invention have found that a frame member almost as thick as the heat-bond film, provided to replace the perimeter or part of the heat-bond film corresponding to the electrode section, can stop movement of the heat-bond film which is molten under heating and pressure for laminating the plate components by hot pressing, and that removing part of the transparent optical film as the outer layer and frame member, both corresponding to the electrode section, can easily expose, to the surface layer section, the portion of the electroconductive section of the electroconductive member which is immediately below the heat-bond film, to form the electrode section on the inner surface, reaching the present invention.

The first invention provides a method of forming an electrode section on the inner surface of the transparent, electromagnetic wave shielding plate, composed of a transparent substrate coated, at least on one side, with an electroconductive member and transparent film in this order, which are laminated into a monolithic structure via a heat-bond film, comprising:

(a) laminating the components of the transparent, electromagnetic wave shielding plate by hot pressing into the monolithic structure, after replacing the perimeter or part of the heat-bond film corresponding to the electrode section by a frame member almost as thick as the heat-bond film, (b) removing the frame member and part of the outer transparent film, both corresponding to the electrode section, or only the outer transparent film for the part corresponding to the electrode section, and (c) exposing the electroconductive section of the electroconductive member to the surface layer section by the above steps (a) and (b).

The second invention provides the method of the first invention for forming an electrode section on the inner surface of the transparent, electromagnetic wave shielding plate, wherein the transparent film is coated with a tackifier layer on the inner surface.

The third invention provides the method of the first or second invention for forming an electrode section on the inner surface of the transparent, electromagnetic wave shielding plate, wherein the electroconductive member is an electroconductive mesh.

The fourth invention provides the method of the first or second invention for forming an electrode section on the inner surface of the transparent, electromagnetic wave shielding plate, wherein the electroconductive member is an electroconductive film.

The fifth invention provides the method of the first or second invention for forming an electrode section on the inner surface of the transparent, electromagnetic wave shielding plate, wherein the electroconductive member is a transparent substrate surface-treated to be electroconductive.

The sixth invention provides a transparent, electromagnetic wave shielding plate which has the electrode section formed by one of the first to fifth inventions.

The seventh invention provides the transparent, electromagnetic wave shielding plate of the sixth invention, wherein an electroconductive gasket having an almost circular or angular cross-section is set on the electrode section.

The eighth invention provides the transparent, electromagnetic wave shielding plate of the sixth or seventh invention, wherein the frame member is electroconductive.

The ninth invention provides an electromagnetic wave shielding front plate for plasma display panels which uses the transparent, electromagnetic wave shielding plate of one of the sixth to eighth inventions.

NOTATION

1 Front plate for plasma display panels (PDP's)
2 Plasma display panel (PDP)
3 Electrode section
3' Electrode section on the main body side
4 Transparent film
5 Transparent substrate (of glass or acrylic plate)
6 Electroconductive member
7 Adhesive layer
8 Anti-reflection (AR) film
9 Tackifier layer
10 Frame member
11 Heat-bond film
12 Electroconductive fiber mesh
13 Near-infrared ray shielding (reflecting) film
14 Electroconductive film
15 Electroconductive layer
16 Electroconductive frame member
17 Electroconductive gasket

PREFERRED EMBODIMENTS OF THE INVENTION

1. Transparent substrate

The transparent substrate for the transparent, electromagnetic wave shielding plate of the present invention may be in the form of film, sheet or plate, and its size (area) may be adequately set according to size of the object for which it is used, e.g., size of display screen for a front plate for PDP. Thickness of the transparent substrate is not limited, but normally in a range from 0.1 to 10 mm in the case of front plate, viewed from the relationship between rigidity and weight of the front plate, preferably 1 to 5 mm.

The material for the transparent substrate is normally glass or synthetic resin, although not limited thereto. The synthetic resins useful for the transparent substrate include acrylic resin, polycarbonate, polystyrene and methyl methacrylate/styrene copolymer. Of these, acrylic resin is more preferable, because it can be easily formed to have a desirable size. The glass is preferably a reinforced one treated thermally or chemically, for resistance to impact.

2. Electroconductive member

The electroconductive member for the transparent, electromagnetic wave shielding plate of the present invention works as the member for shielding electromagnetic waves, and the material therefor is not limited so long as it has an electromagnetic wave shielding function. The examples of the electroconductive member include an electroconductive mesh, electroconductive film and transparent substrate whose surface is made electroconductive.

It is preferable to use an electroconductive fiber mesh as one type of electroconductive meshes for the present invention, because it is light, durable and flexible. The method of producing such an electroconductive fiber mesh is not itself important, and any one may be used regardless how it is produced.

Of the electroconductive fiber meshes, those suitable for the electroconductive member include a synthetic fiber fabric, e.g., of polyester, surface-treated with a resin and the electrolessly plated with 15 to 30% by weight of an electroconductive metal, e.g., nickel or copper and nickel, to be electroconductive, and a synthetic fiber mesh, e.g., of polyester, electrolessly plated with an electroconductive metal, e.g., copper, silver or nickel to be electroconductive, and treated for blackening, for their durability and flexibility.

Fiber size for the electroconductive mesh is normally 10 to 60 $\mu$m, and suitable mesh size is 40 to 200 meshes, determined by a Tyler standard screen.

The other types of electroconductive meshes useful for the present invention include a foil of electroconductive metal net, e.g., copper, silver or aluminum, produced by plasticizing treatment, e.g., rolling, to have a given thickness and then provided with a number of holes by, e.g., punching, to have a lattice-like pattern. The lattice-like pattern is preferably 5 to 50 $\mu$m in line width, 1 to 100 $\mu$m in thickness, and 150 to 800 $\mu$m in pitch between the lines, for electromagnetic wave shielding function and transparency.

The electroconductive film or transparent substrate surface treated to be electroconductive may be produced by various methods for the present invention; e.g., printing a lattice-like pattern with an electroconductive ink on a transparent film or substrate, or forming a lattice-like pattern by, e.g., etching, on a thin metallic film of copper, silver, aluminum or the like formed on a transparent film or substrate.

It may be also produced by forming a transparent, electroconductive layer on a transparent film or substrate. The methods for forming such a layer include the vacuum deposition or sputtering to form at least one transparent, electroconductive layer of metal and/or metal oxide, and deposition of a resin dispersed with fine, electroconductive particles of metal and/or metal oxide.

The metals useful for the above purpose include gold, silver, platinum, palladium, copper, titanium, chromium, molybdenum, nickel and zirconium, of which silver is especially preferable for the layer of higher electroconductivity it can give, and its functions of reflecting and shielding waves in the wavelength region of near-infrared ray, when the transparent, electromagnetic wave shielding plate of the present invention is used for a front plate for PDP. When the metallic layer is provided as the electroconductive layer, it is preferably combined with a dielectric layer to form a multi-layer film to prevent reflection by the metallic layer. The examples of the dielectric layer include those of various metal oxides, nitrides and sulfides.

The examples of the metal oxides include silicon oxide, titanium oxide, tantalum oxide, tin oxide, indium oxide, zirconium oxide and zinc oxide, and a compound oxide of indium and tin oxide.

The metals and metal oxides may be used either individually or in combination.

3. Transparent film

The transparent film for the transparent, electromagnetic wave shielding plate of the present invention, whether it is colored or not, is not limited, so long as it is of a transparent synthetic resin. The synthetic resins useful for the transparent film include polyester, acrylic, polycarbonate, polystyrene, polyamide, polyvinyl chloride, ABS, polyethylene, polypropylene, triacetyl cellulose, cellulose acetate butyrate and cellulose propionate resin. Thickness of the transparent film is not limited, but normally in a range of around 50 to 1000 $\mu$m.

The transparent film for the front plate for PDP's is particularly preferably of the grade for optical devices, and should have at least one of the functions selected from near-infrared ray shielding, anti-reflection, anti-glare and color-correction.

The optical film having these functions may be composed of one film having two or more functions or two or more films each having one function. A transparent substrate may be coated with these transparent films on both sides. Number of the films is not limited. The functions should be adequately selected, depending on purposes of the transparent, electromagnetic wave shielding plate.

The transparent film having a near-infrared ray shielding function may be a thin film of near-infrared ray shielding substance (e.g., silver), near-infrared ray shielding colorant or near-infrared ray absorbing substance (e.g., metal oxides) formed on a transparent base film by, e.g., deposition; film of transparent resin dispersed with the near-infrared ray shielding colorant or metal oxide by, e.g., kneading; or near-infrared ray absorbing resin layer, formed by coating a transparent base film by, e.g., casting, with a solution of the near-infrared ray absorbing colorant or metal oxide uniformly mixed with and dispersed in a resin dissolved in a solvent, and then removing the solvent. The film type is not limited, so long as it exhibits a near-infrared ray shielding function.

The near-infrared ray absorbing colorants useful for the present invention include phthalocyanine-, naphthalocyanine-, diimmonium-based colorants and dithiol-based metal complex, azo compound, and polymethine- and anthraquinone-based colorants.

The metal oxides useful for the present invention include tin-doped indium oxide (ITO) and antimony-doped tin oxide (ATO).

It is preferable that the transparent electromagnetic wave shielding plate, which includes the transparent film provided with a near-infrared ray shielding function, has the transparent substrate having a total ray transmittance of 45% or more for the light in the visible region, and light transmittance of 30% or less for the light having a wavelength in a range from 800 to 1100 nm. The optical film having the above properties can sufficiently secure visibility of the transparent electromagnetic wave shielding plate while securely preventing malfunction of remote controllers. The light in the visible region has a wavelength in a range from 450 to 650 nm.

The method for providing an anti-reflection and/or anti-glare function is not limited, and a known method can be used. The area to be provided with these functions are not limited, but they are preferably provided on the surface of the base film of, e.g., polyester or triacetyl cellulose, where they can be exhibited more efficiently (the film provided with an anti-reflection function may be referred to as anti-reflection (AR) film, and the one with anti-glare function as anti-glare (AG) film).

One of the methods for providing the surface of the base film of, e.g., polyester or triacetyl cellulose, with the laminated layers of the near-infrared shielding and anti-reflection and/or anti-glare functions is to coat the base film with the near-infrared shielding layer on one side and anti-reflection and/or anti-glare layer on the other side, to form the laminate.

The anti-reflection function can be provided by, e.g., laminating the layer of low-refractive substance (e.g., magnesium fluoride or silicon oxide), or multi-layered anti-reflection layer in which the layer of low-refractive substance is combined with a layer of high-refractive substance (e.g., titanium, tantalum, tin, indium, zirconium or zinc oxide). The particularly preferable multi-layered anti-reflection layer comprises layers of indium oxide/tin oxide (ITO) and silicon oxide, or at least 2 layers of silicon oxide and titanium oxide, because the former gives a better anti-reflection effect and is excellent in surface hardness and adhesion, whereas the latter is excellent in transparency, low in production cost, and also excellent in surface hardness and adhesion.

The method for providing an anti-glare function is not limited. For example, the function can be provided by laminating a layer of high-molecular-weight substance dispersed with fine particles to form fine irregularities on the surface.

For the high-molecular-weight layer, a resin of multi-functional monomer, and silicon-, melamine- and epoxy-based crosslinked resins, set by heat or ultraviolet ray, are cited as the preferable materials, although not limited thereto.

The fine particles are incorporated to form irregularities on the surface and thereby to reduce its glare. They are preferably of an inorganic compound.

The fine particles are normally 0.002 to 20 $\mu$m in size, and are incorporated preferably at 1 to 15 parts by weight per 100 parts by weight of the polymerizable compound incorporated.

The inorganic materials useful for the present invention are not limited, but suitable ones include inorganic oxides, e.g., silicon dioxide, aluminum oxide, magnesium oxide, tin oxide, silicon monoxide, zirconium oxide and titanium oxide, of which finely powdered silica with silicon dioxide as the main ingredient is particularly suitable, because of its low cost and availability of narrow particle size distribution. The commercially available particles of silica include Syloid 72 (Fuji-Davison Chemical), Syloid 244 (Fuji-Davison Chemical), Mizukasil (MIZUSAWA INDUSTRIAL CHEMICALS), and Aerosil TT600 (Degussa). The fine silica particles may be of agglomerated colloidal silica. The commercially available colloidal silica products include Ludox AM (Dupont Specialty Chemicals), Kieselsol A200 (Bayer AG), and SNOWTEX-C (Nissan Chemical Industries).

The method for providing a color-correcting function is not limited. For example, the function can be provided by dispersing a colorant in the base film of, e.g., polyethylene terephthalate (PET) or polycarbonate film; coating or laminating the base film of, e.g., polyethylene terephthalate (PET), with a colorant uniformly dispersed beforehand in a solution of polymer, e.g., polyester or polycarbonate resin; or adding a color-correcting dye or pigment to the tackfier layer.

The transparent film for the transparent electromagnetic wave shielding front plate of the present invention for plasma display panels (PDP's) has at least one of the functions selected from the group consisting of near-infrared ray shielding, anti-reflection, anti-glare and color-correcting functions. The preferred embodiments of the present invention include an assembly of 2 transparent films, one being of, e.g., polyester or triacetyl cellulose, as the optical film coated with an anti-reflection film provided with an anti-reflection function and the other being a transparent film coated with a near-infrared ray shielding film provided with a near-infrared ray shielding function. These desired functions allow the front plate to cut off the near-infrared ray which may interfere with remote controllers, and to be low-reflective to prevent reflection of light coming from the outside.

4. Adhesive layer

The method of forming an electrode section on the inner surface of the transparent, electromagnetic wave shielding plate, composed of a transparent substrate coated, at least on one side, with an electroconductive member and transparent film in this order, is mainly characterized by laminating these components by hot pressing into a monolithic structure via an adhesive layer of heat-bond film between the transparent substrate and electroconductive member, after cutting off the perimeter or part of the heat-bond film corresponding to the electrode section and replacing the cut-off portion by a frame member. This laminates all of the components except the electrode section into the monolithic structure, allowing to later remove the frame member and transparent film corresponding to the electrode section and expose the electroconductive section of the electroconductive member to the surface layer.

The heat-bond film useful for the present invention is of an adhesive agent formed into a film so that it can be handled while it is dry. It is disposed between the component member layers, molten and adhering itself to the members under heating and pressure, and cooled and solidified to complete bonding these members to each other. The heat-bond film for the present invention is not limited, and a known one can be used.

When the electroconductive member is in the form of mesh or the like having voids through which the adhesive can pass, use of a heat-bond film may eliminate the adhesive layer on one side arbitrarily chosen. In this case, the heat-bond film passes through the member when molten under heating, to form the adhesive layer on that side.

The typical heat-bond films include those of ethylene/vinyl acetate (EVA) copolymer-, polyamide-, polyurethane-, polyester-, olefin- and acrylic-based resins, of which EVA-, polyamide-, polyurethane- and acrylic-based ones are more preferable for their high transparency. The EVA-based heat-bond film is still more preferable, for its high transparency and availability of diversified types, and being adhesive to a variety of optical films and suffering less temporal changes and aging.

These heat-bond films are normally of thermoplastic resins, which can be formed into films by an adequate means, e.g., extruder for plastics.

The heat-bond film for the present invention is preferably 30 to 300 $\mu$m thick, more preferably 50 to 250 $\mu$m thick. This is for handling of the frame member and adhesive strength, because the component members are laminated after the perimeter or part of the heat-bond film corresponding to the electrode section is cut off and the cut-off portion is replaced by the frame member almost as thick as the heat-bond film.

One of the preferred embodiments of the present invention uses the heat-bond film formed into a film. However, it may be used in combination with tackifier layer or another type of heat-sensitive adhesive, within limits not harmful to the function and effect of the present invention. For example, a tackifier layer formed on the inner side of the transparent film can preset the heat-bond film and frame member to that side of the transparent film, to improve positioning accuracy of the members and simplifying the lamination works. In the case of production of a front plate for PDP's, which includes a number of laminated members, the tackifier layer formed on a relevant member can preset the heat-bond film, possibly reducing number of laminated layers during the lamination step, improving positioning accuracy of the members at the same time, and hence improving lamination efficiency.

The tackifier, when used, may be a known, pressure-sensitive one, normally semi-solid (highly viscous) liquid, adhesive at normal temperature, and fast adhered to an object under pressure. It is preferably the one normally used for optical purposes, such as bonding of an optical, transparent film to a transparent substrate of glass, acrylic plate or the like. However, it is not limited, so long as it is excellent in properties, e.g., resistance to weather and transparency.

The tackifiers useful for the present invention include acrylic-, polyester-, silicon- and rubber-based ones, of which an acrylic-based one is more preferable for its high resistance to weather and transparency.

The tackifier is a semi-solid (highly viscous) liquid, adequately adhesive at normal temperature under pressure, and can increase in adhesion strength when heated.

The common method for forming the tackifier layer is to spread a tackifier, normally after being diluted with a solvent or emulsified to decrease its viscosity, over an object, and then drying the layer by evaporating the solvent, water or the like.

The tackifier layer for the present invention is preferably formed on the inner side (adhesive surface) of the transparent film, viewed from processability, because it can be handled continuously and efficiently. However, it may be formed on the heat-bond film or frame member, and can preset the member in either case.

Thickness of the tackifier layer is not limited, but it is serviceable when it is 5 to 100 μm thick, causing no damage on surface smoothness of the transparent, electromagnetic wave shielding plate or good adhesion/fabricability. It may have an insufficient adhesion strength when it is thinner, and deteriorated transparency or surface smoothness as a result of possible deformation when it is thicker. The tackifier layer is preferably 10 to 50 μm thick, because of improved relationship with the heat-bond film and surface smoothness, and still enhanced adhesion/fabricability.

5. Method of forming an electrode section for the transparent, electromagnetic wave shielding plate The method of the present invention for forming an electrode section on the inner surface of the transparent, electromagnetic wave shielding plate, composed of a transparent substrate coated, at least on one side, with an electroconductive member and transparent film in this order, is mainly characterized by (a) laminating the components of the plate by hot pressing via the heat-bond film into the monolithic structure, after replacing the perimeter or part of the heat-bond film corresponding to the electrode section by a frame member almost as thick as the heat-bond film, (b) removing the frame member and part of the outer transparent film, both corresponding to the electrode section, or only the outer transparent film for the part corresponding to the electrode section, and (c) exposing the electroconductive section of the electroconductive member to the surface layer section by the above steps (a) and (b).

The frame member should have an adequate shape and dimensions for filling the cut-off portion of the heat-bond film. It should be almost as wide as the electrode section, when it is formed. More concretely, it is about 30 to 500 μm thick, 1 to 30 mm wide, and having an almost square or elliptic cross-section and length corresponding to the cut-off portion of the heat-bond film for the electrode section.

The frame member is not limited for its material and shape, and may be made of any material or take any shape, so long as it can stop movement of the molten adhesive agent for the heat-bond film during the hot pressing step. For example, it may be made of a synthetic resin, e.g., polyester, polyethylene, polypropylene or rubber or foam thereof, fabric of fibers, non-woven fabric, paper, or metal. The other examples include the composites containing one or more of the above materials or those treated to be electroconductive. In short, the frame member is not limited for its material and shape, so long as it can stop movement of the molten adhesive agent, and its material and shape may be selected adequately for specific purposes.

The electroconductive section of the electroconductive member immediately below the transparent film can be easily exposed to the surface layer section by removing the frame member and part of the outer transparent film, both corresponding to the electrode section, or only the outer transparent film for the part corresponding to the electrode section as the case may be, to form the transparent, electromagnetic wave shielding plate with the electrode section formed on the inner surface. The transparent film as the outer layer and frame member can be easily removed, after the multi-layered plate is formed, by cutting off the film from the front side by a knife or providing the film with a knife cut of an adequate depth for the film thickness before the lamination step.

The frame member, when it is electroconductive, e.g., when it is made of a material similar to that for the electroconductive member, can be left to work as the gasket. This helps form the electrode section more securely.

The electroconductive section of the electroconductive member can be easily grounded by setting an electroconductive outer frame, having dimensions matching those of the external form, on the exposed inner surface.

The transparent, electromagnetic wave shielding plate with the electrode section on its inner surface, e.g., when used as a front plate for PDP's, can be more securely grounded by disposing an electroconductive gasket on the section left by the frame member, when it is mounted on the PDP's main body. The electroconductive gasket may have an almost circular (e.g., circular or elliptic) or angular cross-section.

The transparent, electromagnetic wave shielding plate as a front plate for PDP's can be formed by one hot-pressing step, even when it is of a multi-layered structure, and hence at high productivity, reduced cost and economically.

The transparent, electromagnetic wave shielding plate of the present invention comprises a transparent substrate coated, at least on one side, with an electroconductive member and transparent film, which are laminated via the heat-bond film into the monolithic structure while providing the electrode section on the inner surface. The electrode sections may be provided on both sides of the transparent substrate.

PREFERRED EMBODIMENTS

The present invention is described more concretely by EXAMPLES with reference to the drawings, which by no means limit the present invention.

EXAMPLE 1

Figure 1:
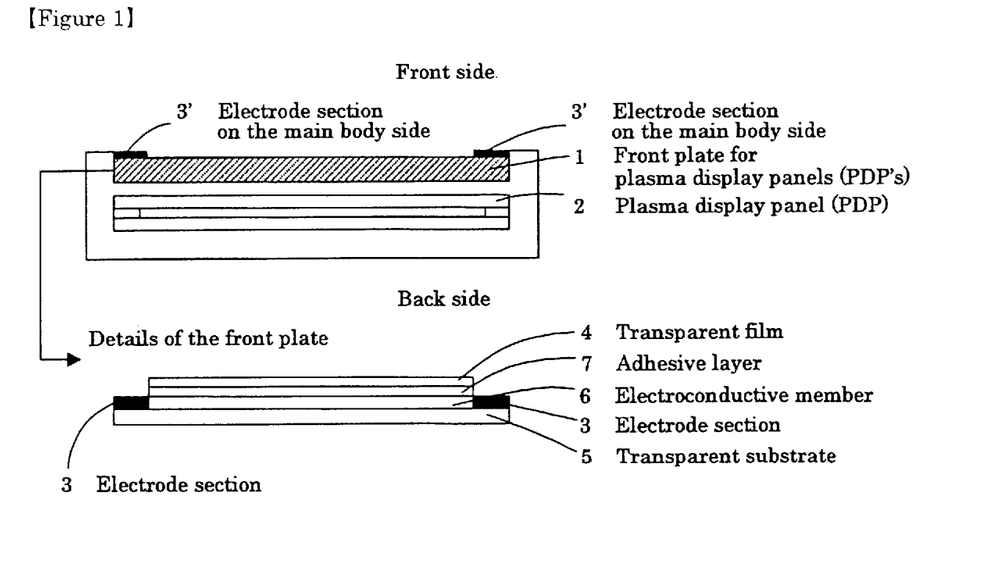
FIG. 1 outlines the front plate for plasma display panels (PDP's) and its cross-sectional view.
Figure 2:
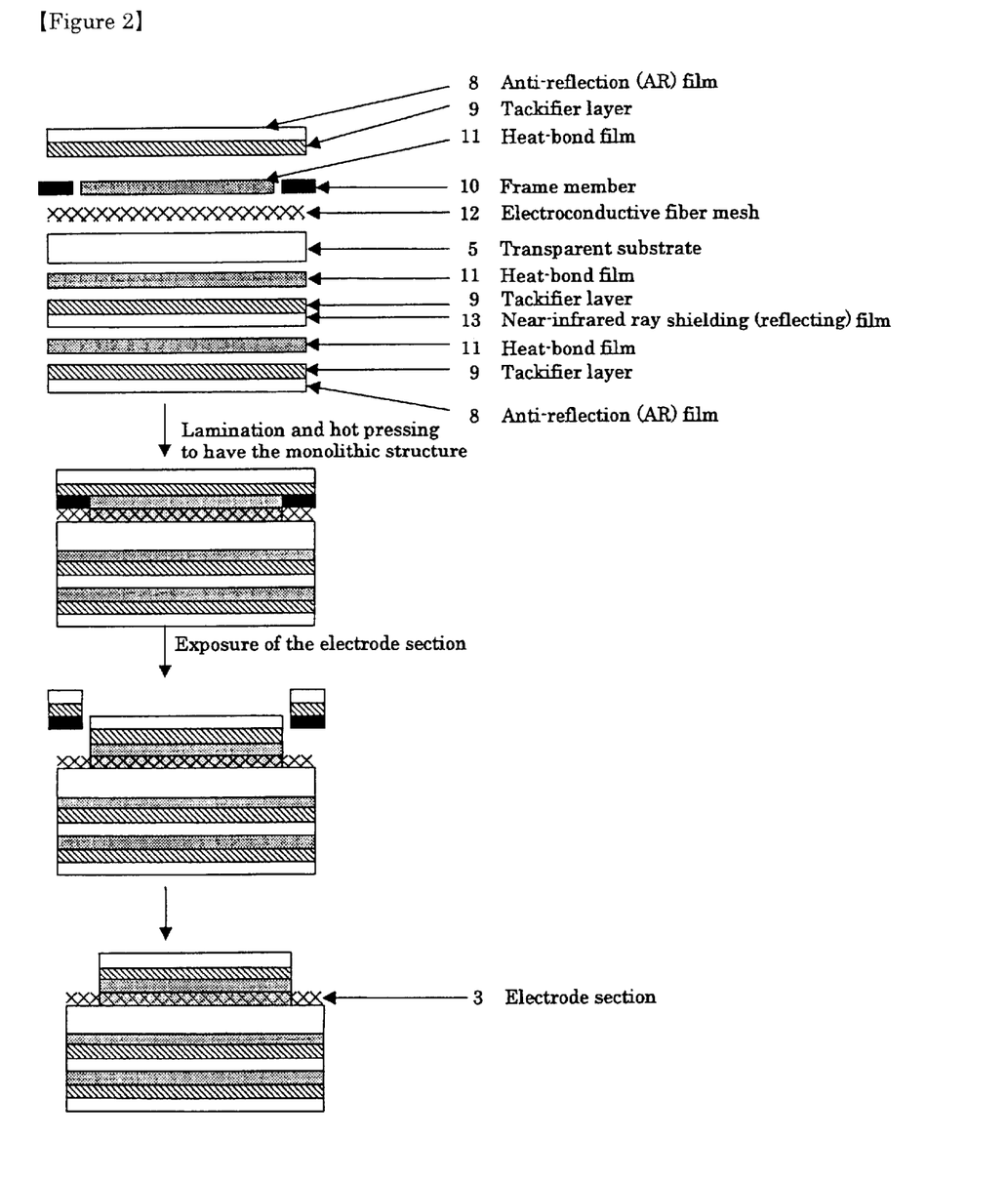
FIG. 2 presents a cross-sectional view of the front plate prepared in EXAMPLE 1 as one embodiment of the present invention.

Outline of the front plate for PDP's and method of producing the same (FIGS. 1 and 2).

FIG. 1 outlines the front plate of the present invention for plasma display panels (PDP's) and its cross-sectional view, and FIG. 2 presents the more detailed cross-sectional view of the one embodiment of the front plate of the present invention.

Referring to FIG. 1, the front plate (1) of the present invention, disposed on the front face of the plasma display panel (2), comprised the transparent film (4), transparent substrate (5), and electroconductive member (6) which were bonded to each other by hot pressing via the adhesive layer (7) to form a monolithic structure, and provided with the electrode section (3) along the inner perimeter, totally or partly. The electrode section (3) comes into contact with the front face of the electrode section (3') on the main body side, provided along the perimeter of the front face of the PDP's main body, to shield the electromagnetic waves radiated from the front face of the PDP (2) and release them into the earth.

Next, FIG. 2 shows a cross-sectional view of the front plate, explaining in more detail the front plate of EXAMPLE 1 as one of the preferred embodiments of the present invention. It comprised the anti-reflection (AR) film (8) as the outermost transparent film (4), and tackifier layer (9), heat-bond film (11) whose perimeter was cut off for the electrode section, frame member (10) filling the cut-off perimeter, electroconductive fiber mesh (12) as the electroconductive member (6) and glass plate as the transparent substrate (5) placed on the inner side of the anti-reflection (AR) film (8), in this order. The transparent substrate (5) was coated, on the other side, with the heat-bond film (11), near-infrared ray (NIR) absorbing film (13) having the tackifier layer (9) coming into contact with the heat-bond film (11), another heat-bond film (11) and another anti-reflection (AR) film (8) as the outermost layer having another tackifier layer (9) coming into contact with the heat-bond film (11), in this order. The multi-layered assembly was placed between mirror-finished plates, treated for degassing, and hot-pressed at 100° C. and 10 kg/cm$^2$ for 60 minutes, to form the monolithic structure.

Then, the frame member (10) corresponding to the electrode section, and part of the AR film (8) as the transparent film and tackifier layer (9) adjacent to the frame member (10) were removed, to partly expose the surface layer of the electroconductive fiber mesh (12).

Next, the component members are described.

The anti-reflection (AR) film (8) (100 μm thick) coated with the acrylic-based, pressure-sensitive tackifier layer (9) (25 μm thick) was a commercial AR film provided with a tackifier (NOF CORPORATION, 2201UV).

The frame member was of PET film, having the same thickness and shape as the heat-bond film (11).

The heat-bond film (11) was an EVA-based heat-bond film (Nippon Matai, ELFAN OH-501) (thickness: 100 μm and melting point: 83° C.).

The electroconductive fiber mesh (12) as the electroconductive member was of MT3-135sss (Nisshin Boseki), 135 by 135 meshes as mesh size and 32 μm in fiber diameter.

The glass plate (5) was of HS-LEX of doubled strength (CENTRAL GLASS), 3 mm thick and 1000 by 600 mm in area.

The near-infrared ray (NIR) absorbing film (13) comprised a PET film as the base film (Toyobo, A4300, 100 μm thick) coated with a near-infrared ray absorbing layer of polycarbonate resin (Teijin Chemical, L-1250Z) dispersed with near-infrared ray absorbing colorants of IRG-022 (NIPPON KAYAKU), NKX-1199 (Hayashibara Seibutu Kagaku Kenkyujo) and MIR-101 (Midori Kagaku), and color-correcting colorants of kaya-sorb violet AR (NIPPON KAYAKU) and kaya-sorb blue N (NIPPON KAYAKU). The film was further coated with an acrylic-based, pressure-sensitive tackifier layer (9) (25 μm thick).

EXAMPLE 2

Figure 3:
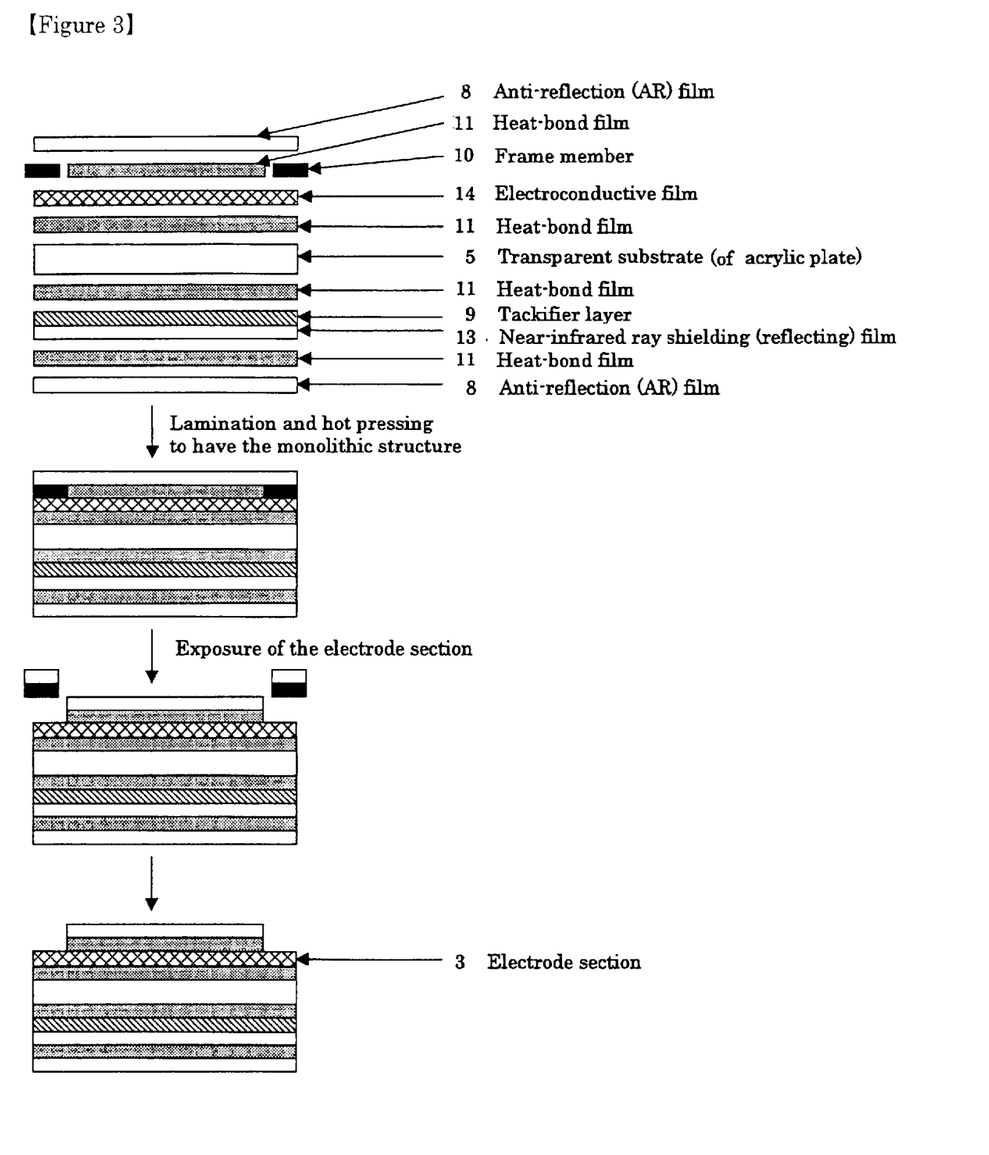
FIG. 3 presents a cross-sectional view of the front plate prepared in EXAMPLE 2 as another embodiment of the present invention.

FIG. 3 is a cross-sectional view of the front plate prepared in EXAMPLE 2, which explains another preferred embodiment of the present invention.

The front plate comprised the AR film (8) as the outermost transparent film (4), and heat-bond film (11) whose perimeter was cut off for the electrode section, frame member (10) filling the cut-off perimeter, electroconductive film (14) as the electroconductive member (6), heat-bond film (11) and acrylic plate (5) as the transparent substrate (5) placed on the inner side of the AR film (8), in this order. The acrylic plate (5) was coated, on the other side, with the heat-bond film (11), near-infrared ray absorbing film (13) having the tackifier layer (9) coming into contact with the heat-bond film (11), another heat-bond film (11) and another AR film (8) as the outermost layer. The multi-layered assembly was placed between mirror-finished plates, treated for degassing, and hot-pressed at 100° C. and 10 kg/cm$^2$ for 60 minutes, to form the monolithic structure.

Then, the frame member (10) corresponding to the electrode section, and part of the AR film (8) as the outer transparent film were removed, to partly expose the surface layer of the electroconductive film (14).

The electroconductive film (14) as the electroconductive member comprised a PET film coated with a copper layer by electroless plating, wherein the copper layer was chemically etched into the metal mesh film and treated for blackening (line width: 10 μm, line pitch: 280 μm, and thickness: 5 μm). The other materials were the same as those used in EXAMPLE 1.

EXAMPLE 3

Figure 4:
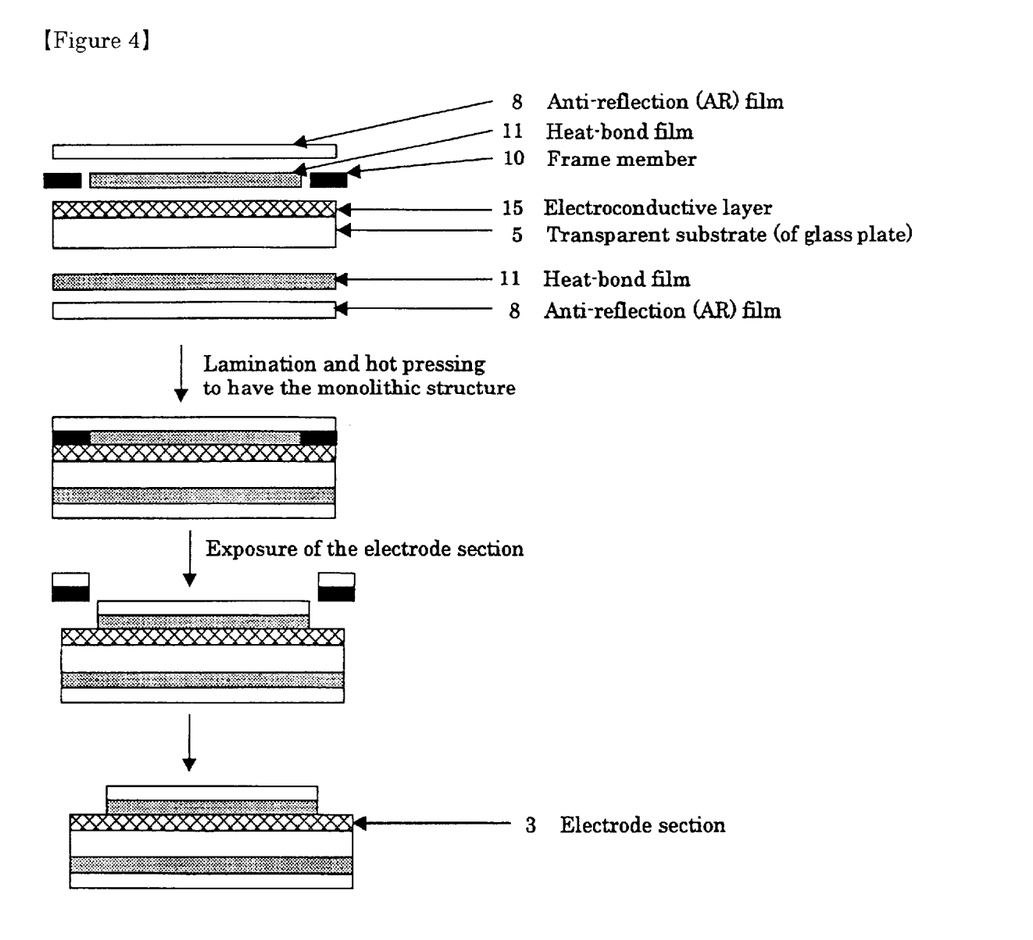
FIG. 4 presents a cross-sectional view of the front plate prepared in EXAMPLE 3 as still another embodiment of the present invention.

FIG. 4 is a cross-sectional view of the front plate prepared in EXAMPLE 3, which explains still another preferred embodiment of the present invention.

The front plate comprised the AR film (8) as the outermost transparent film (4), and heat-bond film (11) whose perimeter was cut off for the electrode section, frame member (10) filling the cut-off perimeter, transparent electroconductive layer (15) as the electroconductive member (6) and glass plate (5) as the transparent substrate (5) placed on the inner side of the AR film (8), in this order. The glass plate (5) was coated, on the other side, with the heat-bond film (11) and AR film (8) as the outermost layer. The multi-layered assembly was placed between mirror-finished plates, treated for degassing, and hot-pressed at 100° C. and 10 kg/cm$^2$ for 60 minutes, to form the monolithic structure.

Then, the frame member (10) corresponding to the electrode section, and part of the AR film (8) as the outer transparent film were removed, to partly expose the surface layer of the transparent electroconductive layer (15).

The glass plate (5) was coated with the transparent electroconductive layer (15), comprising five layers of thin zinc oxide and silver films (ZnO—Ag—ZnO—Ag—ZnO) laminated by sputtering in this order. The other materials were the same as those used in EXAMPLE 1.

Figure 6:
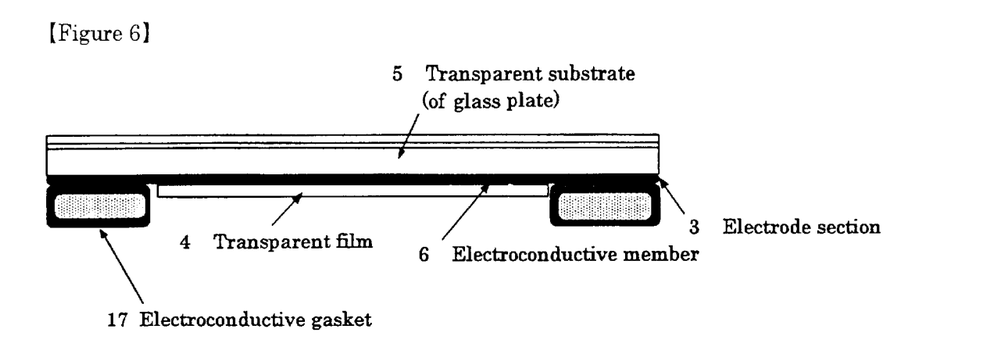
FIG. 6 schematically shows the electromagnetic wave shielding front plate for PDP's prepared in any one of EXAMPLES 1 to 3, provided with an electroconductive gasket.

FIG. 6 shows how the electromagnetic wave shielding front plate for PDP's is securely grounded when it is mounted on the main body of PDP, wherein a gasket was set on each of the front plates prepared in EXAMPLES 1 to 3.

The electroconductive gasket (17) was set at the transparent film (4), laminated on the electroconductive member (6), and on the exposed portion left by the cut-off frame member (10), i.e., at the electrode section (3).

EXAMPLE 4

Figure 5:
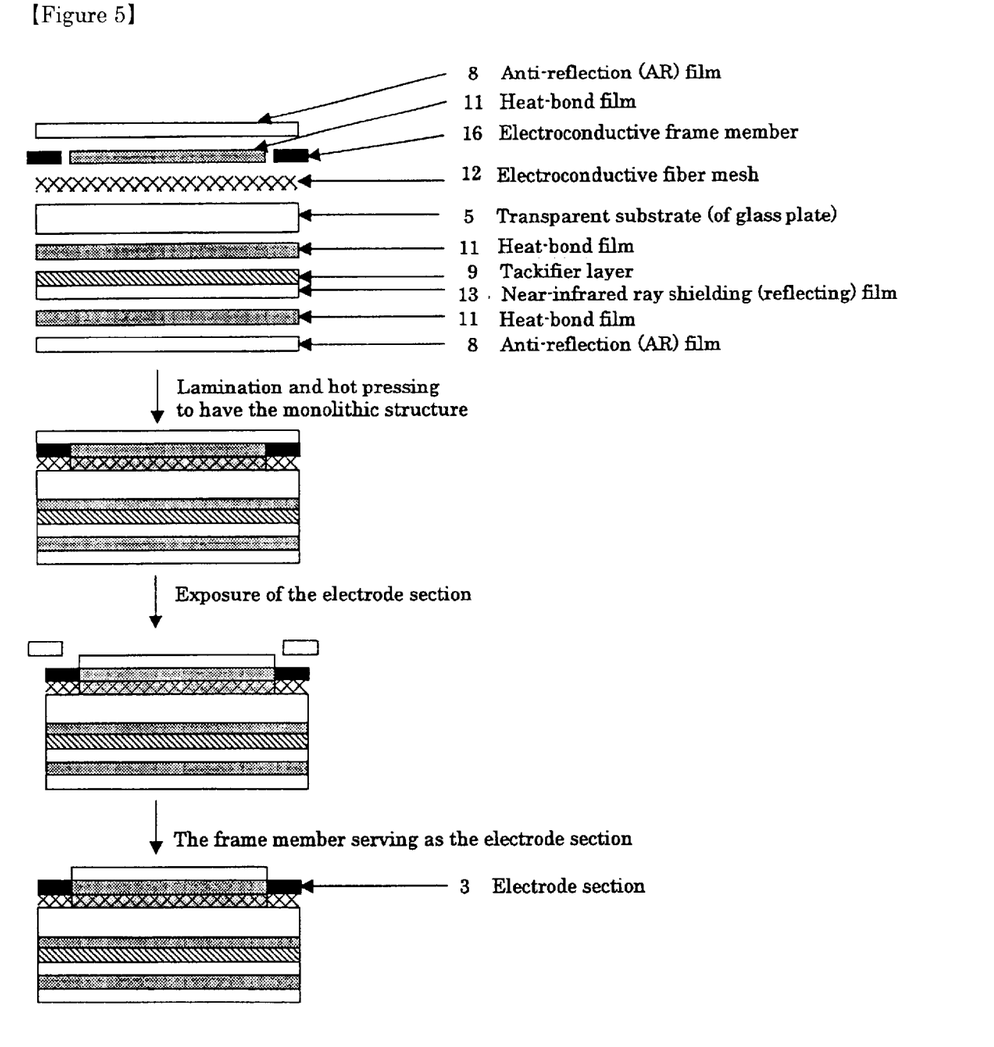
FIG. 5 presents a cross-sectional view of the front plate prepared in EXAMPLE 4 as still another embodiment of the present invention.

FIG. 5 is a cross-sectional view of the front plate prepared in EXAMPLE 4, which explains still another preferred embodiment of the present invention.

The front plate comprised the AR film (8) as the outermost transparent film (4), and heat-bond film (11) whose perimeter was cut off for the electrode section, frame member (16) filling the cut-off perimeter, electroconductive fiber mesh (12) as the electroconductive member (6) and glass plate (5) as the transparent substrate (5) placed on the inner side of the AR film (8), in this order. The glass plate (5) was coated, on the other side, with the heat-bond film (11), near-infrared ray absorbing film (13) having the tackifier layer (9) coming into contact with the heat-bond film (11), another heat-bond film (11) and another AR film (8) as the outermost layer, in this order. The multi-layered assembly was placed between mirror-finished plates, treated for degassing, and hot-pressed at 100° C. and 10 kg/cm$^2$ for 60 minutes, to form the monolithic structure.

Then, part of the AR film (8) as the outer transparent film corresponding to the electrode section was cut off, to expose the electroconductive frame member (16). In this example, the AR film (8) was the only component to be cut off, and the electroconductive frame member (16) served as the electrode section.

An electroconductive gasket (Seiwa Denki, shielded gasket EO2S100035A) was used for the electroconductive frame member (16). It had an almost rectangular cross-section, with expanded urethane resin as the core covered by an electroconductive mesh. It was coated with an electroconductive tackifier on the surface which came in contact with the electroconductive member (6), to prevent its exfoliation from the assembled front plate. The other materials were the same as those used in EXAMPLE 1.

Figure 7:
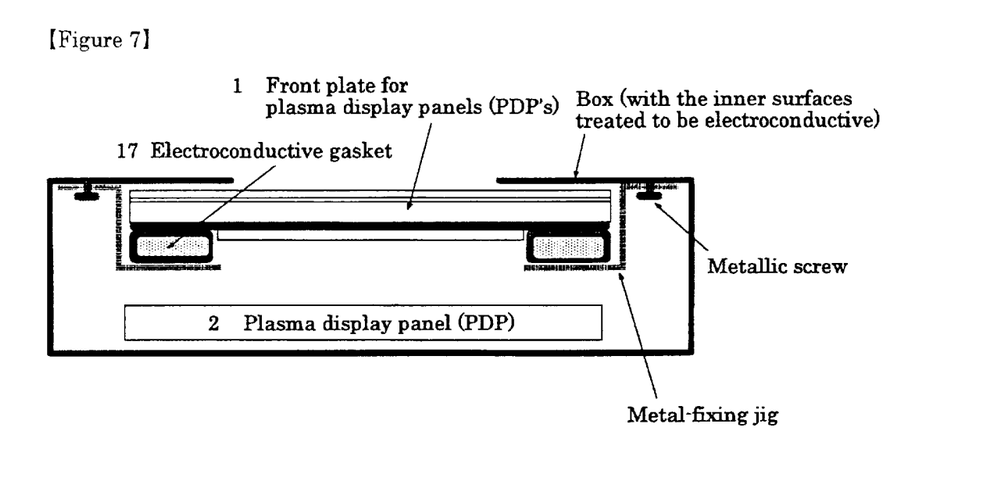
FIG. 7 shows an example of use of the electromagnetic wave shielding plate.
Figure 8:
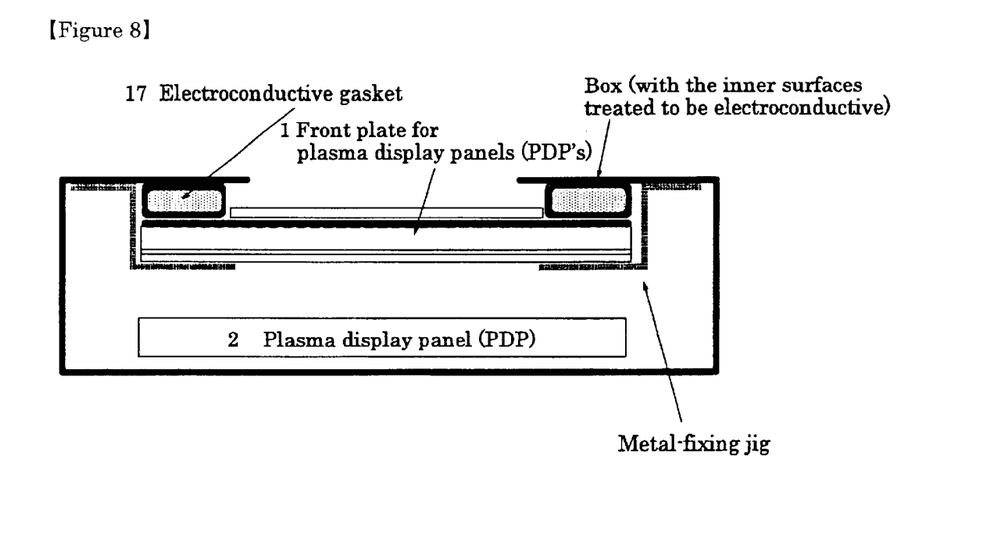
FIG. 8 shows another example of use of the electromagnetic wave shielding plate.

Each of the front plates for plasma display panels (PDP's) prepared in EXAMPLES is used in the form shown in FIG. 7 or 8, to exhibit the sufficient electromagnetic wave shielding and other functions required for the front panel.

The transparent, electromagnetic wave shielding plate of the present invention comprises a transparent substrate coated, at least on one side, with an electroconductive member and transparent film, which are laminated by hot pressing via a heat-bond film into the monolithic structure while providing the electrode section on the inner surface. The member type on the other side of the transparent substrate is not limited. In other words, any or no member may be disposed on that side.

Moreover, the other side of the transparent substrate may be coated with a member other than that for any EXAMPLE, e.g., a transparent film hot-pressed into a monolithic structure with the substrate not aided by a heat-bond film but only by the tackifier layer provided on the transparent film. Still more, the hot-pressed, multi-layered plate of the present invention may be further coated with any member by a separate step with the aid of an adequate adhesive agent.

INDUSTRIAL APPLICABILITY

The transparent electromagnetic wave shielding plate produced by the method of the present invention, which has the electroconductive member whose electroconductive section is exposed to the inner surface, can be easily grounded by setting an electroconductive outer frame, having dimensions matching those of the external form, on the exposed inner surface.

Therefore, the transparent electromagnetic wave shielding plate of the present invention can find a variety of purposes, e.g., front plate for plasma display panels (PDP's), medical devices, car navigation devices, front plate for pin ball machine holders, and building window frames.

The transparent, electromagnetic wave shielding plate, e.g., when used as a front plate for PDP's, can be more securely grounded by disposing an electroconductive gasket having an almost circular cross-section on the section left by the frame member, when it is mounted on the PDP's main body.

The transparent, electromagnetic wave shielding plate as a front plate for PDP's can be formed by one hot-pressing step, even when it is of a multi-layered structure, and hence at high productivity, reduced cost and economically. The component members are fast adhered to each other, especially the transparent film to the transparent substrate or electroconductive member, to form the monolithic structure of sufficient adhesion durability, even at a relatively low hot pressing temperature.

We claim:

1. A method of forming an electrode section on the inner surface of a transparent, electromagnetic wave shielding plate, composed of a transparent substrate coated, at least on one side, with an electroconductive member and transparent film in this order, which are laminated into a monolithic structure via a heat-bond film, comprising:

(a) laminating the components of said transparent, electromagnetic wave shielding plate by hot pressing into the monolithic structure, after replacing the perimeter or part of said heat-bond film corresponding to the electrode section by a frame member almost as thick as the heat-bond film, (b) removing said frame member and part of said outer transparent film, both corresponding to said electrode section, or only said outer transparent film for the part corresponding to said electrode section, and (c) exposing the electroconductive section of said electroconductive member to the surface layer section by the above steps (a) and (b).

2. The method of forming an electrode section on the inner surface of the transparent, electromagnetic wave shielding plate according to claim 1, wherein said transparent film is coated with a tackifier layer on the inner surface.

3. The method of forming an electrode section on the inner surface of the transparent, electromagnetic wave shielding plate according to claim 1 or 2, wherein said electroconductive member is an electroconductive mesh.

4. The method of forming an electrode section on the inner surface of the transparent, electromagnetic wave shielding plate according to claim 1 or 2, wherein said electroconductive member is an electroconductive film.

5. The method of forming an electrode section on the inner surface of the transparent, electromagnetic wave shielding plate according to claim 1 or 2, wherein said electroconductive member is a transparent substrate surface-treated to be electroconductive.

* * * * *